United States Patent
Ashigaki et al.

(10) Patent No.: US 7,674,710 B2
(45) Date of Patent: Mar. 9, 2010

(54) METHOD OF INTEGRATING METAL-CONTAINING FILMS INTO SEMICONDUCTOR DEVICES

(75) Inventors: Shigeo Ashigaki, Sagamihara (JP); Hideaki Yamasaki, Kofu (JP); Tomoyuki Sakoda, Kai (JP); Mikio Suzuki, Nirasaki (JP); Genji Nakamura, Nirasaki (JP); Gert Leusink, Saltpoint, NY (US)

(73) Assignee: Tokyo Electron Limited, Tokyo (JP)

( * ) Notice: Subject to any disclaimer, the term of this patent is extended or adjusted under 35 U.S.C. 154(b) by 565 days.

(21) Appl. No.: 11/561,810

(22) Filed: Nov. 20, 2006

(65) Prior Publication Data
US 2008/0119033 A1   May 22, 2008

(51) Int. Cl.
*H01L 21/4763* (2006.01)

(52) U.S. Cl. .......................... 438/648; 438/62; 438/681; 438/685; 257/E21.17; 257/E21.171; 257/E21.02; 257/E21.585

(58) Field of Classification Search .................. 438/62, 438/648, 681, 685; 257/E21.17, E21.171, 257/E21.02, E21.585
See application file for complete search history.

(56) References Cited

U.S. PATENT DOCUMENTS

| | | | |
|---|---|---|---|
| 2002/0132473 A1* | 9/2002 | Chiang et al. | 438/643 |
| 2006/0068097 A1* | 3/2006 | Yamasaki et al. | 427/248.1 |
| 2006/0170017 A1* | 8/2006 | Muraoka | 257/288 |

FOREIGN PATENT DOCUMENTS

JP   2002-057154   *   2/2002

* cited by examiner

*Primary Examiner*—Long K Tran
(74) *Attorney, Agent, or Firm*—Oblon, Spivak, McClelland, Maier & Neustadt, L.L.P.

(57) ABSTRACT

A method for integrating a metal-containing film in a semiconductor device, for example a gate stack. In one embodiment, the method includes providing a substrate in a process chamber, depositing the tungsten-containing film on the substrate at a first substrate temperature by exposing the substrate to a deposition gas containing a tungsten carbonyl precursor, heat treating the tungsten-containing film at a second substrate temperature greater than the first substrate temperature to remove carbon monoxide gas from the tungsten-containing film, and forming a barrier layer on the heat treated tungsten-containing film. Examples of tungsten-containing films include W, WN, WSi, and WC. Additional embodiments include depositing metal-containing films containing Ni, Mo, Co, Rh, Re, Cr, or Ru from the corresponding metal carbonyl precursors.

29 Claims, 4 Drawing Sheets

METHOD OF INTEGRATING METAL-CONTAINING FILMS INTO SEMICONDUCTOR DEVICES

BACKGROUND OF THE INVENTION

1. Field of the Invention

The present invention relates to semiconductor processing, and more particularly, to a method for integrating metal-containing films formed in a chemical vapor deposition process into semiconductor devices.

2. Description of the Related Art

In the semiconductor industry, the minimum feature sizes of microelectronic devices are approaching the deep submicron regime to meet the demand for faster, lower power microprocessors and digital circuits. The downscaling of complimentary metal oxide semiconductor (CMOS) devices imposes scaling constraints on the gate dielectric material. To increase device reliability and reduce electron leakage from the gate electrode to the transistor channel, semiconductor transistor technology is using high dielectric constant (high-k) materials that allow increased physical thickness of the gate dielectric while maintaining an equivalent gate oxide thickness (EOT) of less than about 10 angstrom.

High-k materials feature a dielectric constant greater than that of $SiO_2$ (k~3.9). High-k materials can include metallic oxides, oxynitrides, silicon oxynitrides, and silicates, for example $Ta_2O_5$ (k~26), $TiO_2$ (k~80), $ZrO_2$ (k~25), $Al_2O_3$ (k~9), HfSiO, HfSiON, $HfO_2$ (k~25)). Integration of high-k materials into gate stack applications can require an ultra-thin interface layer at the surface of the Si substrate to preserve interface state characteristics and form an interface with good electrical properties. However, the presence of an interface layer lowers the overall dielectric constant of the gate stack and, therefore, the interface layer may need to be thin. The quality of the interface layer can affect device performance, as the layer is intimately connected to the channel of the transistor.

Tungsten (W) and tungsten-containing films are potential gate electrodes in gate stacks. W films can be formed by a tungsten-containing precursor in a chemical vapor deposition (CVD) process. Material properties of W films that are deposited from metal-containing precursors may be poor due to incorporation of contaminants into the W films from reaction byproducts and gas phase contaminants during or following the deposition process. Integration of a W film into a gate stack involves contacting the W film with films of other materials which requires the W film to have good surface morphology and low contaminant levels to prevent diffusion of the contaminants into the other materials. For example, outdiffusion of oxygen contaminants from W films is considered to contribute to increased EOT and flatband voltage shifts in gate stacks.

Therefore, new methods are needed for depositing and integrating tungsten-containing films and other metal-containing films with low contaminant levels into semiconductor devices.

SUMMARY OF THE INVENTION

Prior manufacturers deposited W from a tungsten carbonyl precursor and achieved morphology sufficient for their needs at the time by using deposition temperatures in the range of 500° C. However, as control of deposition thickness became more critical, variation in thickness of any interface layer deposited beneath the W layer became more problematic. It was suspected that oxygen may be present in the deposited W layer and that it may cause changes in thickness of the deposited interface layer, but it was not known how to efficiently remove the oxygen while maintaining the structure of the deposited W layer and interface layer. The present inventors realized that oxygen or carbon present in the deposited tungsten layer was contained at least partially in the form of CO. The present inventors discovered that by performing a heat treating process (or annealing process) after deposition of the W layer, but before deposition of another layer, at least a portion of the oxygen present in the W layer could be removed in the form of CO. In this manner, changes in thickness of the deposited interface layer occurring during or after later heating processes could be reduced. Furthermore, the present inventors realized that by covering the heat treated or annealed W layer with a barrier layer or capping layer before the W layer was exposed to air (such as, for example, standard atmosphere outside of the process tool) or other oxygen-rich environment, the state of lowered oxygen content of the heat treated or annealed W layer could be preserved. Afterward, other layers could be deposited on the heat treated or annealed W layer, and these layers could themselves be heat treated or annealed without producing excessive changes in the thickness of the deposited interface layer.

Embodiments of the invention provide a method for integrating metal-containing films deposited from metal carbonyl precursors in semiconductor devices. The metal-containing films can include metals, metal nitrides, metal silicides, and metal carbides containing W, Ni, Mo, Co, Rh, Re, Cr, and Ru deposited from $W(CO)_6$, $Ni(CO)_4$, $Mo(CO)_6$, $CO_2(CO)_8$, $Rh_4(CO)_{12}$, $Re_2(CO)_{10}$, $Cr(CO)_6$, and $Ru_3(CO)_{12}$ precursors, respectively.

According to one embodiment, a method is provided for forming a W film by CVD using a tungsten carbonyl precursor. The W film has low contaminant levels, in particular low carbon monoxide (CO) levels, thereby reducing or preventing increase in EOT and flat band voltage shifts during subsequent processing of the semiconductor device. This enables integration of W films into semiconductor devices, such as gate stacks with ultra-thin interface layers.

According to one embodiment, the method includes providing a substrate in a process chamber, depositing the tungsten-containing film on the substrate at a first substrate temperature by exposing the substrate to a deposition gas containing a tungsten carbonyl precursor, heat treating the tungsten-containing film at a second substrate temperature greater than the first substrate temperature to remove carbon monoxide gas from the tungsten-containing film, and forming a barrier layer on the heat treated tungsten-containing film.

According to another embodiment, the method includes providing a substrate in a process chamber; the substrate having an interface layer thereon and a high-k film on the interface layer, depositing the tungsten-containing film on the high-k film at a first substrate temperature by exposing the substrate to a deposition gas containing a $W(CO)_6$ precursor, heat treating the tungsten-containing film at a second substrate temperature greater than the first substrate temperature to remove carbon monoxide gas from the tungsten-containing film, and forming a barrier layer on the heat treated tungsten-containing film.

BRIEF DESCRIPTION OF THE DRAWINGS

The accompanying drawings, which are incorporated in and constitute apart of the specification, illustrate embodiments of the invention, wherein.

DETAILED DESCRIPTION OF EMBODIMENTS OF THE INVENTION

Gate electrodes containing W films deposited using tungsten carbonyl precursors have shown 2-5 angstrom (angstrom=$10^{-10}$ m) increases in EOT and flatband voltage shifts up to 0.2V after source/drain flash heat treatments at 1050° C. This is a fundamental problem for integrating W films and other metal-containing films into gate stacks. If this problem is not solved, this increase in thickness of the interface layer and flatband voltage shifts may prevent the use of W films in these gate stacks. One explanation for these results includes outdiffusion of oxygen species from the W film at high heat treating temperatures, diffusion of the oxygen species through the high-k film, and reaction with the underlying Si substrate to form or add a 2-5 angstrom thick $SiO_2$ interface layer.

The present inventors have realized that deposition of a W film from a tungsten carbonyl precursor (e.g., $W(CO)_6$) in a CVD process often results in incorporation of CO into the W film. Unless the CO contaminants are removed prior to forming additional layers (barrier layer, cap layer) onto the W film, the CO contaminants contribute to an increase in the thickness of an interface layer between an underlying high-k film and the substrate. The present inventors have further realized that heat treating the deposited W film at a temperature greater than the deposition temperature, for example heat treating temperatures between 500° C. and 1000° C., is effective in removing CO contaminants from the W film, thereby reducing or preventing the increase in the thickness of the interface layer during subsequent processing of the substrate. Removal of CO from a W film deposited using a tungsten carbonyl precursor was verified by thermal desorption spectroscopy (TDS) during a heat treating process.

Embodiments of the invention provide a method for depositing and integrating metal-containing films with low contaminant levels, in particular low CO levels, into semiconductor devices. According to one embodiment of the invention, the method includes depositing a metal-containing film on a substrate at a first substrate temperature by exposing the substrate to a deposition gas containing a metal carbonyl precursor. Following the film deposition, the substrate is heat treated at a second substrate temperature greater than the first substrate temperature to remove CO gas from the metal-containing film. Thereafter, a barrier layer and a cap layer may be formed onto the heat treated metal-containing film to prevent incorporation of gas phase contaminants into the metal-containing film.

Figure 4:
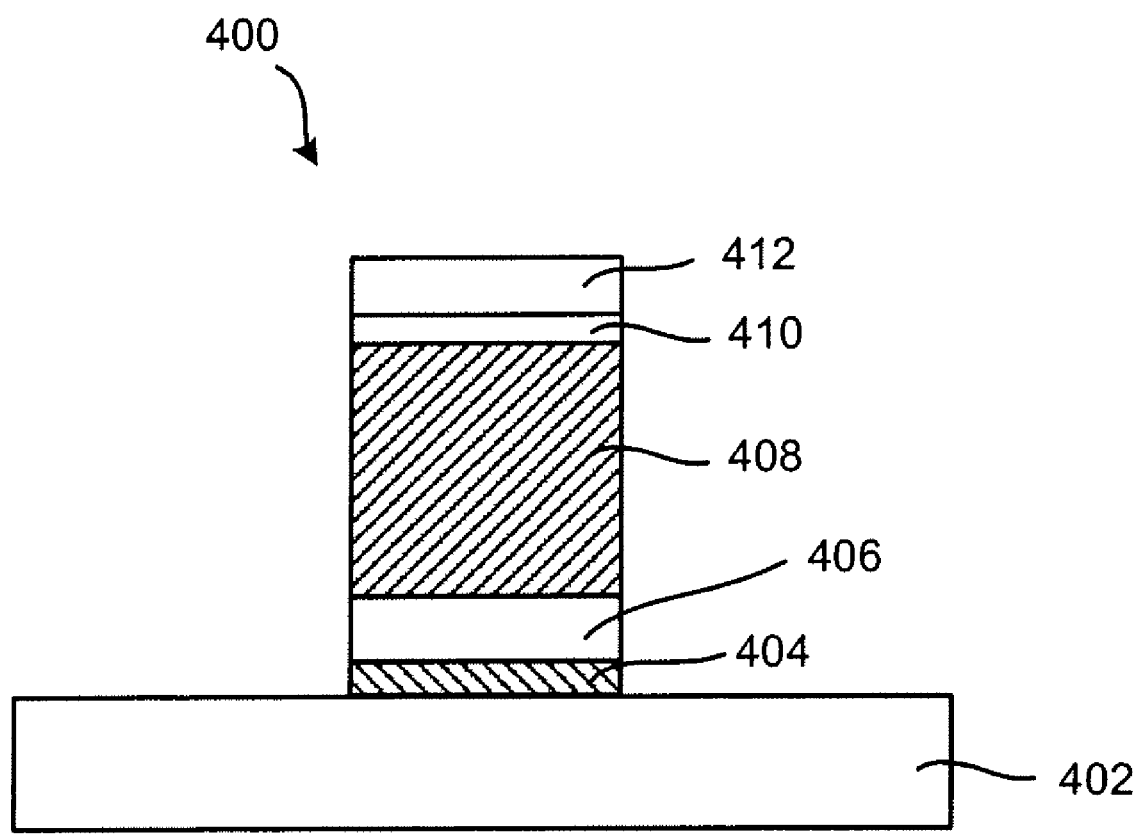
FIG. 4 shows an exemplary gate stack according to an embodiment of the invention.

For example, the metal-containing film may be a tungsten-containing (e.g., W, WN, WSi, WC) film that can be used as a gate electrode in a gate stack containing a high-k film. FIG. 4 shows an exemplary gate stack according to an embodiment of the invention. The gate stack 400 includes a substrate 402 (e.g., Si), an interface layer 404 (e.g., $SiO_2$, SiON, or a combination thereof) on the substrate 402, a high-k layer 406 (e.g., $HfO_2$, HfON, HfSiO, or HfSiON) on the interface layer 404, a tungsten-containing gate electrode film 408 on the high-k layer, a barrier layer 410 (e.g., WN, TaN, TaSiN, or TiN, or a combination thereof) on the tungsten-containing gate electrode film 408, and a cap layer 412 (e.g., poly-Si or amorphous Si) on the barrier layer 410.

Embodiments of the invention will now be described using deposition of tungsten-containing films from a tungsten carbonyl precursor, but as those skilled in the art will readily appreciate, embodiments of the invention may be utilized to deposit any metal-containing film (e.g., metal, metal nitride, metal silicide, or metal carbide) from the corresponding a metal carbonyl precursor.

Figure 1:
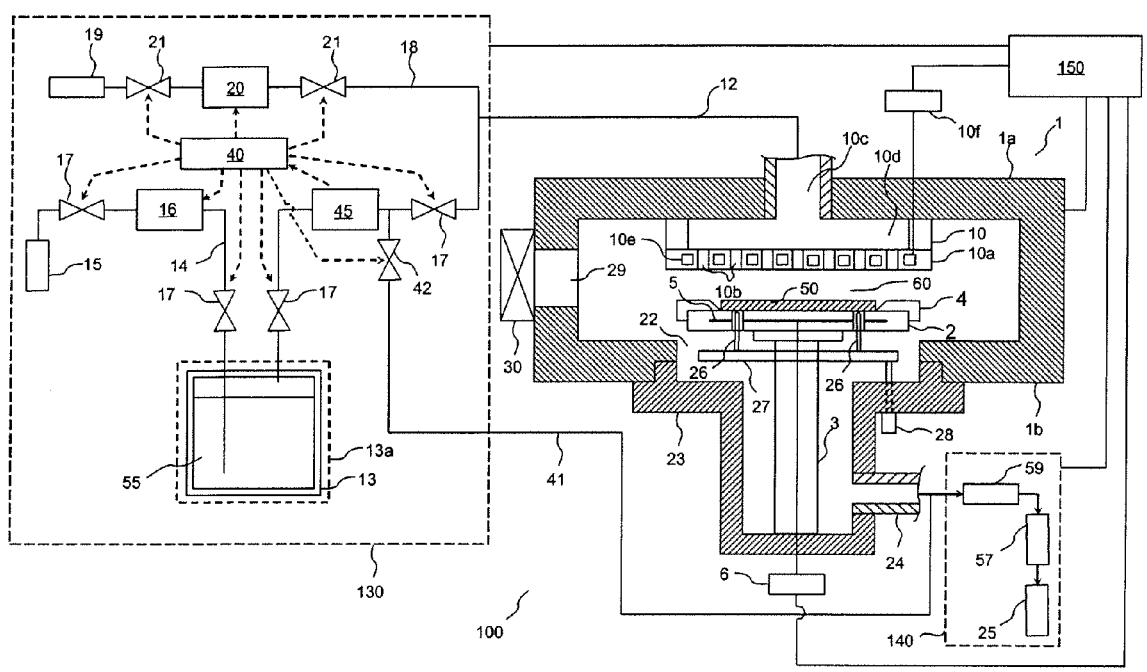
FIG. 1 is a simplified block-diagram of a processing system for depositing a metal-containing film according to an embodiment of the invention.

FIG. 1 is a simplified block-diagram of a processing system for depositing a metal-containing film according to an embodiment of the invention. The processing system 100 comprises a process chamber 1 that contains an upper chamber section 1a, a lower chamber section 1b, and an exhaust chamber 23. A circular opening 22 is formed in the middle of lower chamber section 1b, where bottom section 1b connects to exhaust chamber 23.

Provided inside process chamber 1 is a substrate holder 2 for horizontally holding a substrate (wafer) 50 to be processed. The substrate holder 2 is supported by a cylindrical support member 3, which extends upward from the center of the lower part of exhaust chamber 23. A guide ring 4 for positioning the substrate 50 on the substrate holder 2 is provided on the edge of substrate holder 2. Furthermore, the substrate holder 2 contains a heater 5 that is controlled by power source 6, and is used for heating the substrate 50. The heater 5 can be a resistive heater. Alternately, the heater 5 may be a lamp heater or any other type of heater. The heater 5 may be configured to heat the substrate 50 to a temperature between 400° C. and 1000° C., or even higher.

During processing, the heated substrate 50 can thermally decompose a $W(CO)_6$ precursor and enable deposition of a tungsten-containing film on the substrate 50. The substrate holder 2 is heated to a pre-determined temperature that is suitable for depositing the desired tungsten-containing film onto the substrate 50. A heater (not shown) is embedded in the walls of process chamber 1 to heat the chamber walls to a pre-determined temperature. The heater can maintain the temperature of the walls of process chamber 1 from about 40° C. to about 80° C.

A showerhead 10 is located in the upper chamber section 1a of process chamber 1. Showerhead plate 10a at the bottom of showerhead 10 contains multiple gas delivery holes 10b for delivering a deposition gas containing the $W(CO)_6$ precursor into a processing zone 60 located above the substrate 50. The processing zone 60 is a volume defined by the substrate diameter and by the gap between the substrate 50 and the showerhead 10.

An opening 10c is provided in the upper chamber section 1b for introducing a deposition gas from gas line 12 into a gas distribution compartment 10d. Concentric coolant flow channels 10e are provided for controlling the temperature of the showerhead 10 and thereby preventing the decomposition of the $W(CO)_6$ precursor gas inside the showerhead 10. A coolant fluid such as water, can be supplied to the coolant flow channels 10e from a coolant fluid source 10f for controlling the temperature of showerhead 10 from about 20° C. to about 100° C.

The gas line 12 connects the precursor delivery system 130 to process chamber 1. A precursor container 13 contains a solid $W(CO)_6$ precursor 55, and a precursor heater 13a is provided for heating the precursor container 13 to maintain the $W(CO)_6$ precursor 55 at a temperature that produces a desired vapor pressure of the $W(CO)_6$ precursor. The $W(CO)_6$ precursor 55 can comprise a relatively high vapor pressure, $P_{vap}$~1 Torr at 65° C. Therefore, only moderate heating of the precursor source 13 and the precursor gas delivery lines (e.g., gas line 12) is required for delivering the $W(CO)_6$ precursor to the process chamber 1. Furthermore, the $W(CO)_6$ precursor does not thermally decompose at temperatures below about 200° C. This characteristic can significantly reduce decomposition of the $W(CO)_6$ precursor due to interactions with heated chamber walls and gas phase reactions.

In one embodiment, $W(CO)_6$ precursor vapor can be delivered to the process chamber 1 without the use of a carrier gas or, alternatively, a carrier gas can be used to enhance the delivery of the precursor vapor to the process chamber 1. Gas line 14 can provide a carrier gas from gas source 15 to the precursor container 13, and a mass flow controller (MFC) 16 and valves 17 can be used to control the carrier gas flow. When a carrier gas is used, it may be introduced into the lower part of precursor container 13 so as to percolated through the solid $W(CO)_6$ precursor 55. Alternatively, the carrier gas may be introduced into the precursor source 13 and distributed across the top of the solid $W(CO)_6$ precursor 55. A sensor 45 is provided for measuring the total gas flow from the precursor container 13. The sensor 45 can, for example, comprise a MFC, and the amount of $W(CO)_6$ precursor delivered to the process chamber 1 can be determined and controlled using sensor 45 and valves 17. Alternatively, the sensor 45 can comprise a light absorption sensor to measure the concentration of the $W(CO)_6$ precursor in the gas flow to the process chamber 1.

A bypass line 41 is located downstream from sensor 45 and connects gas line 12 to exhaust line 24. Bypass line 41 is provided for evacuating gas line 12 and for stabilizing the supply of the $W(CO)_6$ precursor to the process chamber 1. In addition, a valve 42, located downstream from the branching of gas line 12, is provided on bypass line 41.

Heaters (not shown) are provided to independently heat gas lines 12, 14, and 41, where the temperatures of the gas lines can be controlled to avoid condensation of the $W(CO)_6$ precursor in the gas lines. The temperature of the gas lines can be controlled from about 20° C. to about 100° C., or from about 25° C. to about 60° C.

Dilution gases can be supplied from gas source 19 to gas line 12 using gas line 18. The dilution gases can be used to dilute the deposition gas or to adjust the deposition gas partial pressure(s). Gas line 18 contains a MFC 20 and valves 21. MFCs 16 and 20, and valves 17, 21, and 42 are controlled by controller 40, which controls the supply, shutoff, and the flow of a carrier gas, the $W(CO)_6$ precursor gas, and a dilution gas. Sensor 45 is also connected to controller 40 and, based on output of the sensor 45, controller 40 can control the carrier gas flow through mass flow controller 16 to obtain the desired $W(CO)_6$ precursor flow to the process chamber 1.

In addition or in the alternate, the gas source 19 may be utilized to supply other gases to the deposition gas, including a nitrogen-containing gas (e.g., $NH_3$) to form a metal nitride (MN) film, a silicon-containing gas (e.g., $SiH_4$) to form a metal silicide (MSi) film, and a carbon-containing gas (e.g., $CH_4$) to form a metal carbide (MC) film.

Exhaust line 24 connects exhaust chamber 23 to vacuum pumping system 140. Vacuum pump 25 is used to evacuate process chamber 1 to the desired degree of vacuum and to remove gaseous species from the process chamber 1 during processing. An automatic pressure controller (APC) 59 and a trap 57 can be used in series with the vacuum pump 25. The vacuum pump 25 can include a turbo-molecular pump (TMP) capable of a pumping seed up to 800 liters per second (and greater). Alternatively, the vacuum pump 25 can include a dry pump. During processing, the deposition gas can be introduced into the process chamber 1 and the chamber pressure adjusted by the APC 59. The APC 59 can comprise a butterfly-type valve or a gate valve. The trap 57 can collect unreacted precursor material and by-products from the process chamber 1.

In the process chamber 1, three substrate lift pins 26 (only two are shown) are provided for holding, raising, and lowering the substrate 50. The substrate lift pins 26 are affixed to plate 27, and can be lowered to below to the upper surface of substrate holder 2. A drive mechanism 28 utilizing, for example, an air cylinder, provides means for raising and lowering the plate 27. The substrate 50 can be transferred in and out of process chamber 1 through gate valve 30 and chamber feed-through passage 29 via a robotic transfer system (not shown) and received by the substrate lift pins. Once the substrate 50 is received from the transfer system, it can be lowered to the upper surface of the substrate holder 2 by lowering the substrate lift pins 26.

A processing system controller 150 includes a microprocessor, a memory, and a digital I/O port capable of generating control voltages sufficient to communicate and activate inputs of the processing system 100 as well as monitor outputs from the processing system 100. Moreover, the processing system controller 150 is coupled to and exchanges information with process chamber 1, precursor delivery system 130 that includes controller 40 and precursor heater 13a, vacuum pumping system 140, power source 6, and coolant fluid source 10f. In the vacuum pumping system 140, the processing system controller 150 is coupled to and exchanges information with the automatic pressure controller 59 for controlling the pressure in the process chamber 1. A program stored in the memory is utilized to control the aforementioned components of a processing system 100 according to a stored process recipe. One example of processing system controller 150 is a DELL PRECISION WORKSTATION 610™, available from Dell Corporation, Dallas, Tex.

Figure 2:
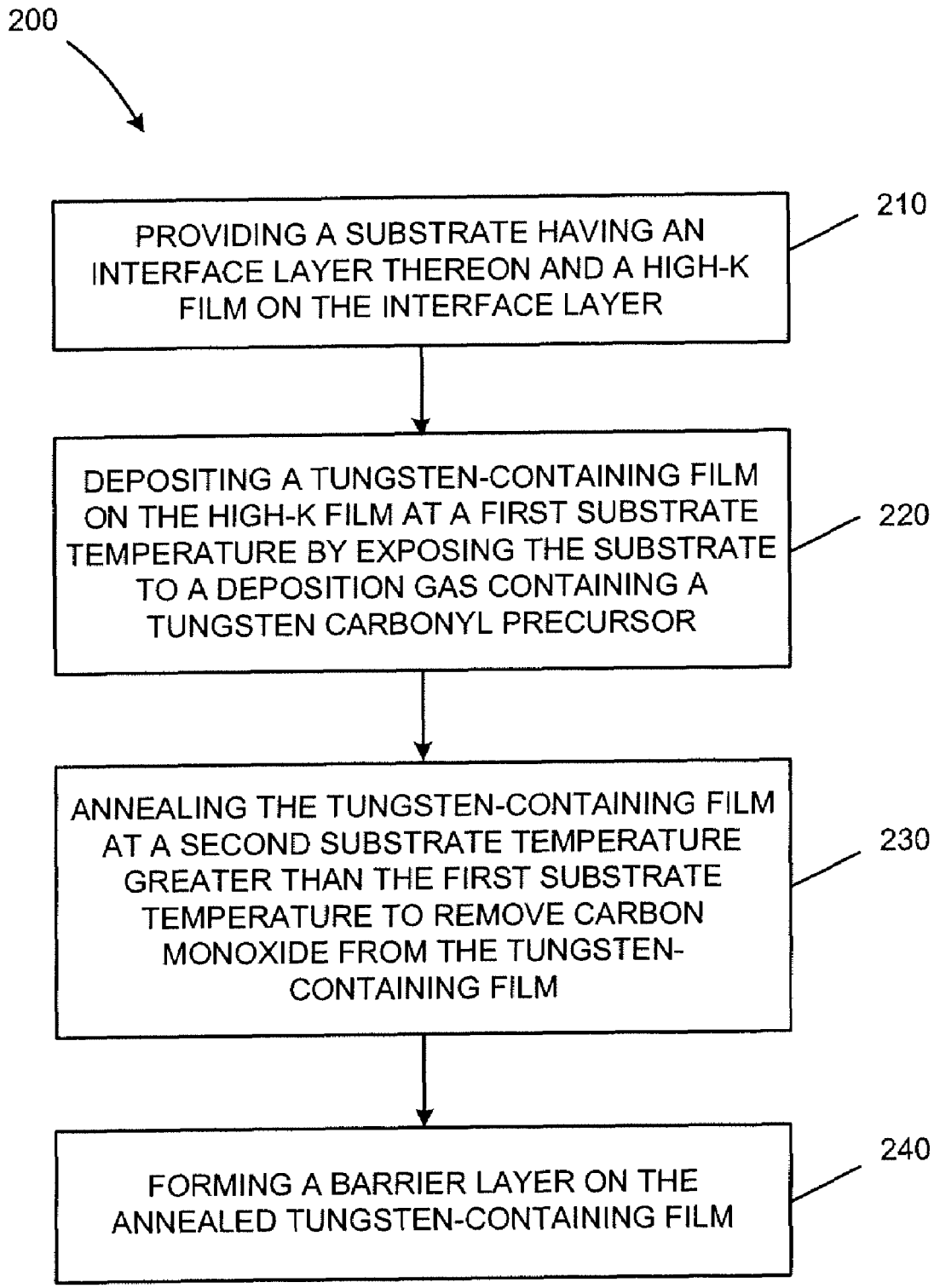
FIG. 2 shows a flowchart for integrating a metal-containing film into a semiconductor device according to an embodiment of the invention.

FIG. 2 shows a flowchart for integrating a metal-containing film into a semiconductor device according to an embodiment of the invention. The process 200 includes, in step 210, providing a substrate having an interface layer thereon and a high-k film on the interface layer in a process chamber. The process chamber can be the process chamber 1 described and shown in FIG. 1. The substrate (wafer) can be of any size, for example a 200 mm substrate, a 300 mm substrate, or an even larger substrate. For example, the substrate can be a Si substrate. The high-k film can, for example, include $Ta_2O_5$, $TiO_2$, $ZrO_2$, $Al_2O_3$, $Y_2O_3$, HfSiO, HfSiON, $HfO_2$, $ZrO_2$, ZrSiO, ZrSiON, TaSiO, SrO, SrSiO, LaO, LaSiO, YO, YSiO, or BaO, or a combination of two or more thereof. A thickness of the high-k film can, for example, be between about 1 nm and about 3 nm, and preferably about 1.5 nm.

In step 220, a tungsten-containing film is deposited on the high-k film at a first substrate temperature by exposing the substrate to a deposition gas containing a tungsten carbonyl precursor and optionally an inert gas, a reducing gas, or both. The deposition gas can further contain a nitrogen-containing gas (e.g., $NH_3$) to form a metal nitride (MN) film, a silicon-containing gas (e.g., $SiH_4$) to form a metal silicide (MSi) film, and a carbon-containing gas (e.g., $CH_4$) to form a metal carbide (MC) film. The inert gas can be a dilution gas and/or a carrier gas. The first substrate temperature can be between 400° C. and 600° C., for example about 500° C. However, the first temperature can be above 600° C. in some processes. When the first temperature is above 600° C., CO in the precursor may decompose and result in carbon deposited in the tungsten film. At such temperatures, the deposition of W and out-gassing of CO may occur simultaneously. This may be desirable, particularly when depositing tungsten-carbide layers. Other process parameters for the CVD process can, for example, utilize a chamber pressure less than about 1 Torr, for example less than 300 mTorr. Alternatively, the chamber pressure can be less than about 200 mTorr, for example 150 mTorr. A carrier gas flow rate can be less than about 1000 sccm. A dilution gas flow rate can be less than about 2000 sccm. A $W(CO)_6$ precursor gas flow rate can be between about 0.1 sccm and about 200 sccm. The carrier gas and the dilution gas can comprise at least one of an inert gas and a $H_2$ gas. The inert gas can comprise at least one of Ar, He, Ne, Kr, Xe, and $N_2$.

In step 230, the tungsten-containing film is heat treated at a second substrate temperature greater than the first substrate temperature to remove carbon monoxide gas from the tungsten-containing film. The second substrate temperature can be between 500° C. and 1000° C., for example between 600° C. and 800° C. Step 230 may be performed at low process chamber pressures with low partial pressures of oxygen-containing gases (e.g., $O_2$, $H_2O$, CO) to prevent oxidation of the tungsten-containing film or a Si substrate during the heat treating. Process chamber pressures and partial pressures of oxygen-containing gases that allow removal of CO gas from the tungsten-containing film and prevent oxidation of the tungsten-containing film or Si substrate may be determined using design of experiment (DOE) procedures. In one example, partial pressures of $O_2$, $H_2O$, or CO in a process gas may be plotted versus substrate temperature to determine the maximum partial pressures of $O_2$, $H_2O$, and CO that may be present without oxidizing the tungsten-containing film or the Si substrate. According to one embodiment, step 230 may be performed in the presence of a high purity inert gas (e.g., Ar) and optionally $H_2$ gas, utilizing gas pressures between about 1 Torr and 760 Torr.

In step 240, a barrier layer is formed onto the heat treated tungsten-containing film. Exemplary barrier layers include WN, TaN, TaSiN, or TiN, or a combination of two or more thereof. The barrier layer protects the underlying heat treated tungsten-containing film from the gaseous atmosphere and prevents or reduces oxidation of the tungsten-containing film and the Si substrate. The barrier layer can, for example, be deposited by CVD or physical vapor deposition (PVD). The barrier layer (e.g., WN) may be deposited in the same process chamber as the tungsten-containing film, in a process chamber of a different processing system on the same processing tool (e.g., a CVD-TaSiN barrier layer), or in a process chamber on a different processing tool (e.g., PVD-TiN barrier layer). Similarly, a Si cap layer can be deposited on the barrier layer in the same process chamber as the barrier layer deposition (e.g., a CVD-TaSiN barrier layer), in a process chamber of a different processing system (e.g., a CVD-Si processing system) in the same processing tool, or in a process chamber of a different processing tool (e.g., a TELFORMULA™ batch processing tool available from Tokyo Electron Limited, Akasaka, Japan).

In principle, a reducing agent is not needed for thermally depositing tungsten-containing films from tungsten carbonyl precursors (or other metal-containing films from the corresponding metal carbonyl precursors), because the tungsten atom in the tungsten carbonyl precursor is already zero-valent. Alternatively, a reducing agent, e.g., a $H_2$ gas, can be employed to aid in the deposition of the tungsten-containing film. Thermal decomposition of tungsten carbonyl precursors and subsequent W deposition, is thought to proceed predominantly by CO elimination and desorption of CO by-products from the substrate. Incorporation of CO by-products into the tungsten-containing film during deposition can result from incomplete decomposition of the tungsten carbonyl precursor, incomplete removal of CO by-products from tungsten-containing film, and re-adsorption of CO by-products from the process chamber onto the tungsten-containing film.

If CO contaminants that are incorporated into the tungsten-containing film or adsorbed on the surface of the tungsten-containing film are not removed following tungsten-containing film deposition, the CO contaminants increase the resistivity of the tungsten-containing film and provide oxygen species that can diffuse through the underlying high-k film and contribute to increased thickness of the interface layer between the high-k film and the substrate.

During deposition of a tungsten-containing film, incorporation of CO-byproducts into the tungsten-containing film can be reduced by (1) lowering the process pressure, (2) increasing the substrate temperature, and (3) using a high flow rate of a dilute deposition gas. In one embodiment of the invention, a high flow rate of a dilute deposition gas is effective in reducing the partial pressure of CO by-products on the surface of the tungsten-containing film and the partial pressure of CO in the process chamber, thereby reducing the amount of CO contaminants in the tungsten-containing film. However, post-deposition heat treating of the tungsten-containing film further removes CO contaminants from the tungsten-containing film or the interface of the tungsten-containing film and the high-k film.

Figure 3:
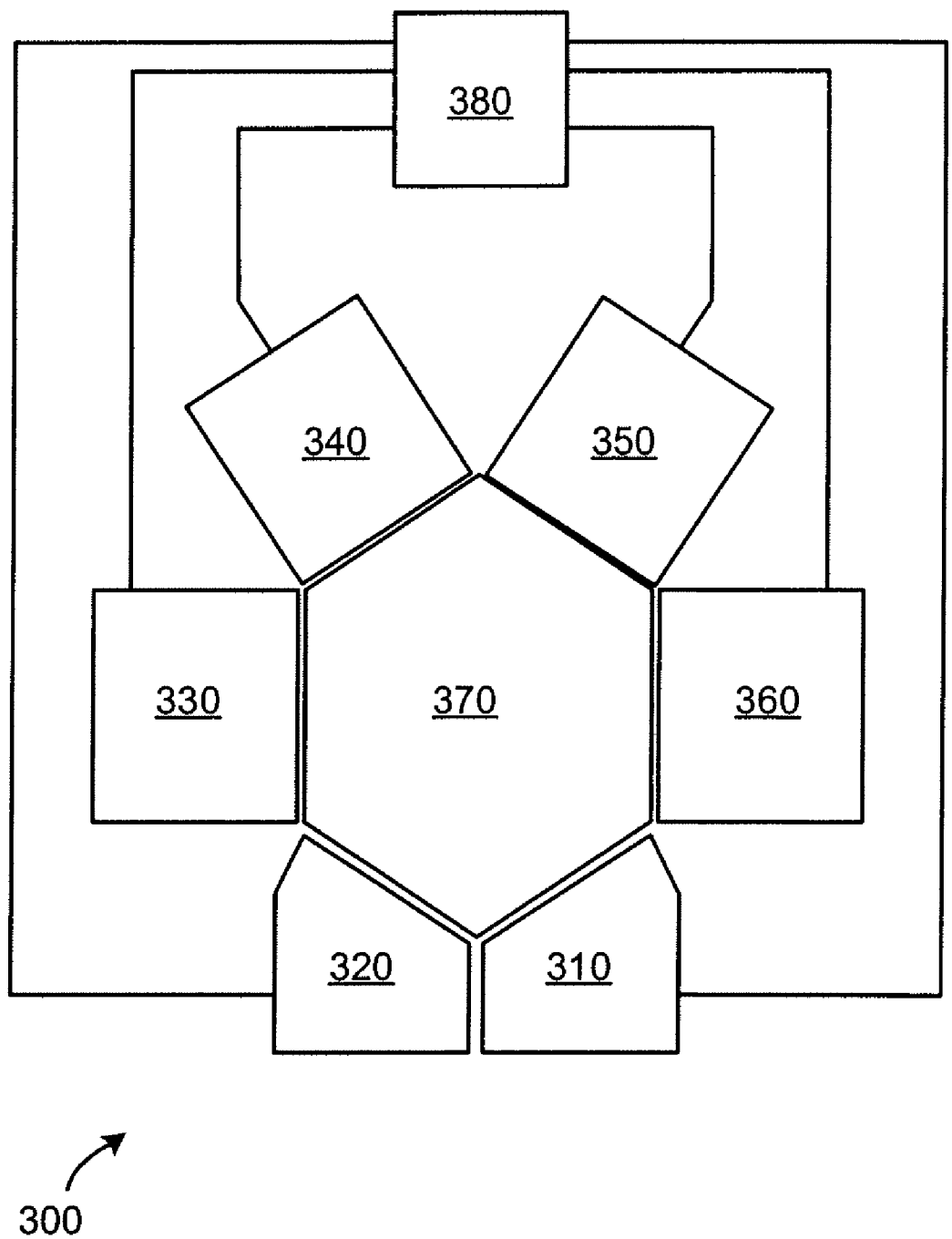
FIG. 3 is a simplified block-diagram of a processing tool for integrating a metal-containing film into a semiconductor device according to an embodiment of the invention.

FIG. 3 is a simplified block-diagram of a processing tool for integrating a metal-containing film into a semiconductor device according to an embodiment of the invention. The processing tool 300 contains substrate loading chambers 310 and 320, processing systems 330-360, robotic transfer system 370, and controller 380. Although not shown, the processing tool 300 may also contain a substrate aligning system and a cool-down system configured for cooling processed substrates. Furthermore, the processing tool 300 may also contain a processing system configured for degassing and/or pre-cleaning substrates. Degassing may be carried out following evacuation when the substrate is disposed in the processing tool 300. The degassing can, for example, be performed by heating the substrate to a temperature between about 100° C. and about 500° C. in the presence of an inert gas such as Ar. Pre-cleaning may include single wafer wet or dry cleaning techniques to remove contaminants from the surface of the substrate. Still further, the process tool 300 may contain a processing system configured for forming an interface layer on a substrate, for example a $SiO_2$ layer, a SiON layer, or a combination thereof.

The substrate loading chambers 310 and 320 are utilized for transferring substrates into the processing tool 300 for processing, and out of the processing tool 300 following processing. Since portions of the processing tool 300 are normally under vacuum, the substrate loading chambers 310 and 320 are configured to evacuate substrates disposed in the processing tool 300. As shown in FIG. 3, the substrate loading chambers 310 and 320 are coupled to the robotic transfer system 370. The robotic transfer system 370 is configured to transfer substrates between the substrate loading chambers 310 and 320 and the processing systems 330-360. The robotic transfer system 370 can, for example, be purged with an inert gas such as Ar under vacuum conditions (e.g., about 100 mTorr or less).

The processing system 330 can be configured for depositing a high-k film on the substrate by chemical vapor deposition (CVD), physical vapor deposition (PVD), plasma enhanced CVD (PECVD), atomic layer deposition (ALD), or plasma enhanced ALD (PEALD). The processing system 340 can be configured for depositing a metal-containing film on a substrate, for example on a high-k film deposited in processing system 340. The processing system 340 can, or example, be processing system 100 described in FIG. 1. The processing system 350 is configured for heat treating the metal-containing film to remove carbon monoxide gas from the metal-containing film. In one example, the processing system 350 may be a low pressure annealing system (LPA) available from Tokyo Electron Limited, Akasaka, Japan. Alternately, the heat treating may be performed in the processing system 340. The processing system 360 is configured for forming a barrier layer on the tungsten-containing film.

Following degassing and/or pre-cleaning, the substrate is transported by the robotic transfer system 370 to the processing system 330 for depositing a high-k film. Alternately, the substrate may have a high-k film thereon when introduced into the processing tool 300. Next, the substrate is transported by the robotic transfer system 370 to the processing system 340 for depositing a metal-containing film onto the high-k film. Next, the substrate is transported by the robotic transfer system 370 to the processing system 350 for heat treating the metal-containing film, and a barrier layer is formed onto the heat treated metal-containing film in processing system 360. Thus, the processing tool 300 allows for performing the processing steps 210-240 of FIG. 2 without exposure to air during and between the steps 210-240. This enables formation of clean films with good control over the interfaces between the different films and layers and low contaminations in the different films and layers. Although not shown, the processing tool 300 may contain or be in vacuum connection with additional processing systems for further processing of the substrate following the process in step 240. For example, an additional processing system may be configured for depositing a cap layer on the barrier layer.

The processing tool 300 can be controlled by a controller 380. The controller 380 can be coupled to and exchange information with substrate loading chambers 310 and 320, processing systems 330-360, and robotic transfer system 370. The controller 380 can operate substrate transfer operations within the processing tool 300 and substrate processing performed within the processing systems 330-360. In one embodiment of the invention, the controller 380 can be programmed through a program stored in the memory of the controller 380 to perform processes of embodiments of the invention and any functions associated with monitoring the processes. The controller 380 may be a systems controller, a dedicated hardware circuit, a programmed general purpose computer.

It should be understood that various modifications and variations of the present invention may be employed in practicing the invention. It is therefore to be understood that, within the scope of the appended claims, the invention may be practiced otherwise than as specifically described herein.

The invention claimed is:

1. A method for processing a substrate, the method comprising:
providing the substrate in a process chamber; depositing a high-k film on the substrate;
depositing a tungsten-containing film directly on the high-k film at a first substrate temperature by exposing the substrate to a deposition gas containing a tungsten carbonyl precursor;
heat treating the tungsten-containing film at a second substrate temperature greater than the first substrate temperature to remove carbon monoxide gas from the tungsten-containing film;
wherein the first substrate temperature is between 400° C. and 600° C. and the second substrate temperature is between 500° and 1000° C.; and
forming a barrier layer on the heat treated tungsten-containing film.

2. The method of claim 1, wherein the first substrate temperature is about 500° C.

3. The method of claim 1, wherein the second substrate temperature is between 600° C. and 800° C.

4. The method of claim 1, wherein the heat treating further comprises exposing the tungsten-film to a process gas having a partial pressure of an oxygen-containing gas that does not result in oxidation of the tungsten-containing film or the substrate.

5. The method of claim 1, wherein the deposition gas further comprises an inert gas, $H_2$, a nitrogen-containing gas, a silicon-containing gas, a carbon-containing gas, or a combination thereof.

6. The method of claim 1, wherein a process chamber pressure is less than about 1 Torr during deposition of the tungsten-containing film.

7. The method of claim 1, wherein the tungsten carbonyl precursor comprises $W(CO)_6$.

8. The method of claim 1, wherein the tungsten-containing film comprises W, WN, WSi, or WC, or a combination thereof.

9. The method of claim 1, wherein the barrier layer comprises WN, TaN, TaSiN, or TiN, or a combination of two or more thereof.

10. The method of claim 1, further comprising:
forming a cap layer onto the barrier layer.

11. The method of claim 10, wherein the cap layer comprises poly-Si or amorphous Si.

12. The method of claim 1, wherein the deposition is performed in a first processing system and the heat treating is performed in a second processing system.

13. The method of claim 1, wherein the substrate comprises an interface layer disposed thereon and the high-k film formed on the interface layer.

14. The method of claim 13, wherein the interface layer comprises $SiO_2$, SiON, or a combination thereof.

15. The method of claim 13, wherein the high-k film comprises $Ta_2O_5$, $TiO_2$, $ZrO_2$, $Al_2O_3$, $Y_2O_3$, HfSiO, HfSiON, $HfO_2$, $ZrO_2$, ZrSiO, ZrSiON, TaSiO, SrO, SrSiO, LaO, LaSiO, YO, YSiO, or BaO, or a combination of two or more thereof.

16. The method of claim 1, wherein the heat treating is performed before another layer is deposited on the tungsten-containing film.

17. A method for processing a substrate, the method comprising:
providing the substrate in a process chamber;
depositing a high-k film on the substrate;
depositing a metal-containing film directly on the high-k film at a first substrate temperature by exposing the substrate to a deposition gas containing a metal carbonyl precursor;
heat treating the metal-containing film at a second substrate temperature greater than the first substrate temperature to remove carbon monoxide gas from the metal-containing film;
wherein the first substrate temperature is between 400° C. and 600° C. and the second substrate temperature is between 500° C. and 1000° C.; and
forming a barrier layer on the heat treated metal-containing film.

18. The method of claim 17, wherein the metal carbonyl precursor comprises $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, or $Ru_3(CO)_{12}$, and the metal-containing film comprises a metal, a metal nitride, a metal silicides, or a metal carbide containing W, Ni, Mo, Co, Rh, Re, Cr, or Ru.

19. The method of claim 17, wherein the substrate comprises a substrate having an interface layer thereon and the high-k film formed on the interface layer.

20. The method of claim 19, wherein the interface layer comprises $SiO_2$, SiON, or a combination thereof.

21. The method of claim 19, wherein the high-k film comprises $Ta_2O_5$, $TiO_2$, $ZrO_2$, $Al_2O_3$, $Y_2O_3$, HfSiO, HfSiON, $HfO_2$, $ZrO_2$, ZrSiO, ZrSiON, TaSiO, SrO, SrSiO, LaO, LaSiO, YO, YSiO, or BaO, or a combination of two or more thereof.

22. The method of claim 17, wherein the heat treating is performed before another layer is deposited on the metal-containing film.

23. A method for forming a gate stack, the method comprising:
providing a substrate in a process chamber;
forming an interface layer on the substrate; forming a high-k film on the interface layer;
depositing a metal-containing film directly on the high-k film at a first substrate temperature by exposing the substrate to a deposition gas containing a metal carbonyl precursor;
heat treating the metal-containing film at a second substrate temperature greater than the first substrate temperature to remove carbon monoxide gas from the metal-containing film;
wherein the first substrate temperature is between 400° C. and 600° C. and the second substrate temperature is between 500° C. and 1000° C.; and
forming a barrier layer on the heat treated metal-containing film.

24. The method of claim 23, wherein the interface layer comprises $SiO_2$, SiON, or a combination thereof.

25. The method of claim 23, wherein the high-k film comprises $Ta_2O_5$, $TiO_2$, $ZrO_2$, $Al_2O_3$, $Y_2O_3$, HfSiO, HfSiON, $HfO_2$, $ZrO_2$, ZrSiO, ZrSiON, TaSiO, SrO, SrSiO, LaO, LaSiO, YO, YSiO, or BaO, or a combination of two or more thereof.

26. The method of claim 23, wherein the metal carbonyl precursor comprises $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, or $Ru_3(CO)_{12}$, and the metal-containing film comprises a metal, a metal nitride, a metal silicides, or a metal carbide containing W, Ni, Mo, Co, Rh, Re, Cr, or Ru.

27. The method of claim 23, wherein forming the barrier layer on the heat treated metal-containing film occurs before exposure of the metal-containing film to an oxygen rich gas.

28. The method of claim 23, wherein forming the barrier layer on the heat treated metal-containing film occurs before exposure of the heat treated metal-containing film to standard atmosphere.

29. The method of claim 23, wherein the heat treating is performed before another layer is deposited on the metal containing film.

* * * * *